US012693310B2

(12) United States Patent
Sato

(10) Patent No.: US 12,693,310 B2
(45) Date of Patent: Jul. 28, 2026

(54) PROBE

(71) Applicant: YOKOWO CO., LTD., Tokyo (JP)

(72) Inventor: Kenichi Sato, Tomioka (JP)

(73) Assignee: YOKOWO CO., LTD., Tokyo (JP)

( * ) Notice: Subject to any disclaimer, the term of this patent is extended or adjusted under 35 U.S.C. 154(b) by 114 days.

(21) Appl. No.: 18/284,072

(22) PCT Filed: Mar. 18, 2022

(86) PCT No.: PCT/JP2022/012576

§ 371 (c)(1),
(2) Date: Sep. 26, 2023

(87) PCT Pub. No.: WO2022/202658

PCT Pub. Date: Sep. 29, 2022

(65) Prior Publication Data

US 2024/0175897 A1 May 30, 2024

(30) Foreign Application Priority Data

Mar. 26, 2021 (JP) ................................. 2021-053184
Feb. 10, 2022 (JP) ................................. 2022-019334

(51) Int. Cl.
*G01R 1/067* (2006.01)
*C22C 5/04* (2006.01)
*C22C 9/00* (2006.01)
*C22C 30/02* (2006.01)

(52) U.S. Cl.
CPC ................ *G01R 1/067* (2013.01); *C22C 5/04* (2013.01); *C22C 9/00* (2013.01); *C22C 30/02* (2013.01)

(58) Field of Classification Search
CPC ................ C22C 9/00; C22C 5/04; C22C 9/06
See application file for complete search history.

(56) References Cited

U.S. PATENT DOCUMENTS

| | | | |
|---|---|---|---|
| 1,935,897 A | 11/1933 | Wise | |
| 11,112,431 B2 | 9/2021 | Felici | |
| 11,131,690 B2 | 9/2021 | Crippa | |
| 2010/0012935 A1* | 1/2010 | Hino | ...................... H10P 14/412 |
| | | | 257/750 |
| 2010/0244869 A1* | 9/2010 | Uchida | .............. G01R 1/06722 |
| | | | 324/755.01 |

(Continued)

FOREIGN PATENT DOCUMENTS

| | | |
|---|---|---|
| CN | 107257928 A | 10/2017 |
| JP | 2004-093355 A | 3/2004 |

(Continued)

OTHER PUBLICATIONS

International Search Report and Written Opinion mailed on May 17, 2022, received for PCT Application PCT/JP2022/012576, filed on Mar. 18, 2022, 10 pages including English Translation.

(Continued)

*Primary Examiner* — Giovanni Astacio-Oquendo
*Assistant Examiner* — Temilade S Rhodes-Vivour
(74) *Attorney, Agent, or Firm* — XSENSUS LLP

(57) ABSTRACT

A probe includes greater than or equal to 15 mass % and less than or equal to 60 mass % of Pd, greater than or equal to 3 mass % and less than or equal to 79.9 mass % of Cu, and greater than or equal to 0.1 mass % and less than or equal to 75 mass % of at least one of Ni and Pt.

15 Claims, 12 Drawing Sheets

(56) References Cited

U.S. PATENT DOCUMENTS

| | | | | |
|---|---|---|---|---|
| 2010/0284851 A1* | 11/2010 | Aruga | .................... | H01R 13/03 |
| | | | | 420/471 |
| 2014/0377129 A1 | 12/2014 | Shishino et al. | | |
| 2015/0197834 A1 | 7/2015 | Kumita et al. | | |
| 2015/0301081 A1* | 10/2015 | Hirano | .............. | G01R 1/06755 |
| | | | | 324/755.01 |
| 2017/0117244 A1* | 4/2017 | Yamada | ............... | C25D 7/0607 |
| 2017/0307657 A1 | 10/2017 | Crippa | | |
| 2019/0139721 A1* | 5/2019 | Niitsuma | ................ | C22C 30/00 |
| 2019/0276916 A1* | 9/2019 | Kawasaki | ............ | B23K 35/302 |
| 2019/0361050 A1 | 11/2019 | Felici | | |

FOREIGN PATENT DOCUMENTS

| | | | |
|---|---|---|---|
| JP | 2008133522 A | 6/2008 |
| JP | 2009209436 A | 9/2009 |
| JP | 2010084226 A | 4/2010 |
| JP | 2017-025354 A | 2/2017 |
| JP | 2017-145496 A | 8/2017 |
| JP | 2020507771 A | 3/2020 |
| KR | 20230160852 A | 11/2023 |
| TW | 201333225 A | 8/2013 |
| TW | 201702392 A | 1/2017 |
| WO | 2014/049874 A1 | 4/2014 |

OTHER PUBLICATIONS

Teeriniemi, J., P. Taskinen, and K. Laasonen. "Modeling of complex ternary structures: Cu-Ni-Pd alloys via first-principles." Computational Materials Science 115 (2016): pp. 202-207.

Shigenori Ichikawa, "A Study of Dental Casting Ni-Pd-Cu System Alloys", Department of Dental Technology, Tokyo Dental College, May 29, 1982, 33pp.

Statement of Submission of Publications, JP2022-019210, Jul. 2, 2025, 6pp.

Request for Inspection, JP2022-019210, Aug. 7, 2025, 1p.

Office Action issued Sep. 8, 2025 in corresponding Taiwanese application 111110065, 7pp.

Office Action issued Dec. 10, 2025, in related U.S. Appl. No. 18/284,172, 6pp.

Korean Office Action issued Apr. 23, 2026, in Korean Application No. 10-2023-7034138, 5pp.

Fang Yang, Ultrasmall Pd-Cu-Pt Trimetallic Twin Icosahedrons Boost the Electrocatalytic Performance of Glycerol Oxidation at the Operating Temperature of Fuel Cells. Adv. Funct. Mater. 2020, 30, 1908235, pp. 1-9.

Korean Office Action (App. No. 10-2023-7035355) issued on Mar. 10, 2026, 4pp.

* cited by examiner

PROBE

CROSS-REFERENCE TO RELATED APPLICATIONS

The present application is based on PCT filing PCT/JP2022/012576, filed Mar. 18, 2022, which claims priority from Japanese Patent Application Nos. 2021-053184, filed Mar. 26, 2021, and 2022-019334, filed Feb. 10, 2022, the entire contents of each are incorporated herein by reference.

TECHNICAL FIELD

The present invention relates to a probe.

BACKGROUND ART

To inspect an inspection target object such as an integrated circuit, the inspection target object may be electrically connected to an inspection board via a probe provided at a socket. The probe may include an alloy of Pd, Cu, and Ag.

Patent Document 1 describes one example of an alloy of Pd, Cu, and Ag. The alloy described in Patent Document 1 includes not less than 16% and not more than 50% Cu, from about 35% to about 59% Pd, and not less than 4% Ag.

RELATED DOCUMENT

Patent Document

Patent Document 1: US Patent Publication No. 1935897 Specification

SUMMARY OF INVENTION

Technical Problem

An alloy of Pd, Cu, and Ag may be used as a material constituting a probe. Repeated contact and electrically connecting of a tip end of the probe including the alloy of Pd, Cu, and Ag with a solder of an inspection target object would be, however, result in the tendency of mutual diffusion of a component such as Sn included in the solder and a component included in the probe due to a factor such as Joule heat. The diffusion of the component included in the probe would cause consumption of the tip end of the probe. The consumption of the tip end of the probe would cause fluctuation in contact resistance between the probe and the solder. The use of the probe including the alloy of Pd, Cu, and Ag would accordingly result in frequently washing and replacing the tip end of the probe, which would decrease inspection efficiency.

One example of an object of the present invention is to suppress a component included in a probe from diffusing into a solder. Other objects of the present invention will become apparent from the description in the present description.

Solution to Problem

An aspect of the present invention is a probe including:
greater than or equal to 15 mass % and less than or equal to 60 mass % of Pd;
greater than or equal to 3 mass % and less than or equal to 79.9 mass % of Cu; and greater than or equal to 0.1 mass % and less than or equal to 75 mass % of at least one of Ni and Pt.

Advantageous Effects of Invention

According to the aspect of the present invention, a component included in a probe can be suppressed from diffusing into a solder.

BRIEF DESCRIPTION OF DRAWINGS

FIG. 5 A graph illustrating a relation between a mass ratio of Pd included in the test material and hardness of the test material for examples 3, 6, and 10 where a mass ratio of Ni included in the test material is 10 mass % and examples 7 and 11 where a mass ratio of Ni included in the test material is 1 mass %.

FIG. 6 A graph illustrating a relation between a mass ratio of Ni included in the test material and a thickness of a diffusion layer between the test material and a solder for the examples 2 to 4 where a mass ratio of Pd included in the test material is 45 mass %, examples 5 to 8 where a mass ratio of Pd included in the test material is 35 mass %, and the examples 10 to 11 where a mass ratio of Pd included in the test material is 25 mass %.

DESCRIPTION OF EMBODIMENTS

Hereinafter, an embodiment and variants of the present invention will be described with reference to the drawings. In all the drawings, a similar constituent element is denoted by a similar reference sign, and the description thereof will be appropriately omitted.

In the present description, unless otherwise specified, the ordinal numbers such as "first", "second", and "third" are attached merely to distinguish similarly named constituents, and do not mean a particular feature (e.g., an order or an importance degree) of the constituents.

Figure 1:
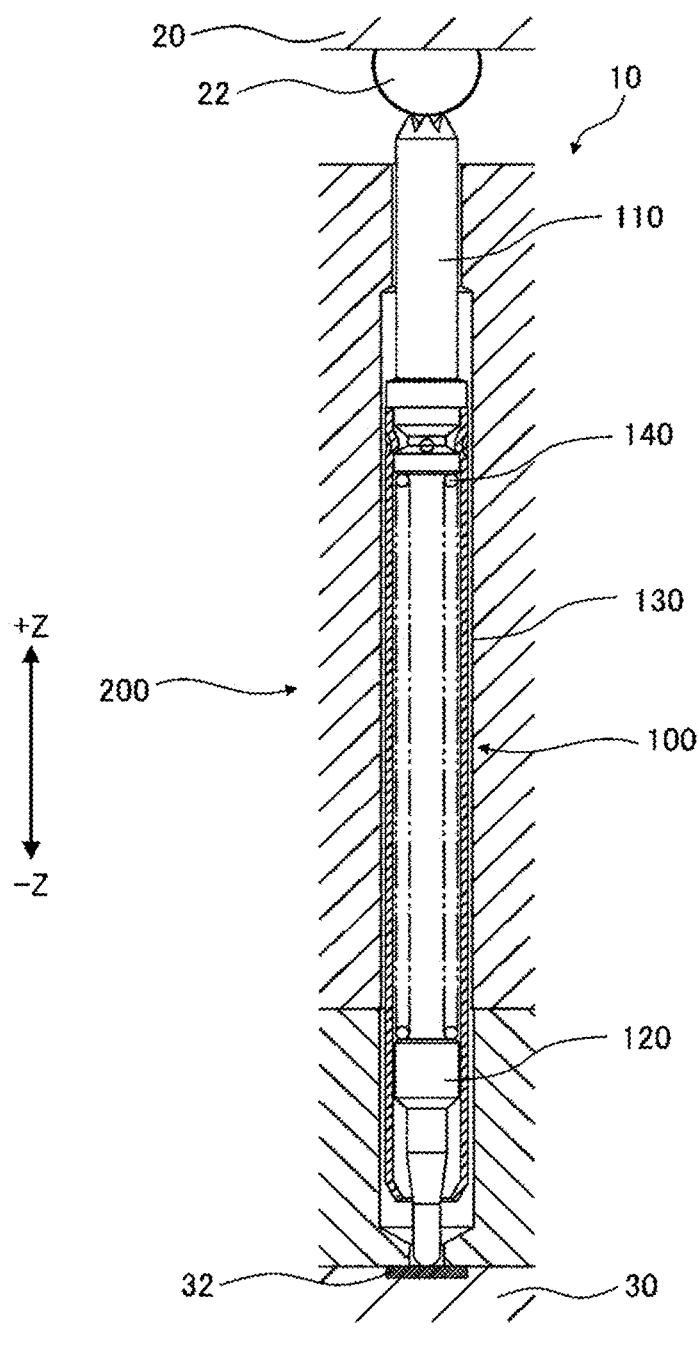
FIG. 1 A sectional view of a socket according to an embodiment.

FIG. 1 is a sectional view of a socket 10 according to an embodiment.

In FIG. 1, an arrow indicated by "+Z" indicates an upward direction in a vertical direction, and an arrow indicated by "−Z" indicates a downward direction in the vertical direction. Hereinafter, a direction orthogonal to the vertical direction will be referred to as a horizontal direction as necessary.

The socket 10 includes a probe 100 and an insulation support body 200. The probe 100 is provided in a through hole formed in the insulation support body 200. The probe 100 includes a first plunger 110, a second plunger 120, a tube 130, and a spring 140. FIG. 1 illustrates a state where an inspection target object 20 is inspected by an inspection board 30 by using the probe 100. Specifically, in the state illustrated in FIG. 1, a solder ball 22 of the inspection target object 20 and a pad 32 of the inspection board 30 are electrically connected to each other via the probe 100.

The tube 130 extends in the vertical direction. The spring 140 is positioned inside the tube 130. The probe 100 may not include the tube 130. The spring 140 is spirally wound around an imaginary axis passing through a center of the tube 130 in the vertical direction.

The first plunger 110 is positioned on an upper end side of the spring 140. The first plunger 110 is biased by the spring 140, upward, i.e., toward a direction away from the second plunger 120. In the state where the inspection target object 20 is inspected by the inspection board 30, the first plunger 110 is connected to the inspection target object 20 positioned above the probe 100. In this state, a tip end, i.e., an upper end, of the first plunger 110 contacts with the solder ball 22 of the inspection target object 20. In the example illustrated in FIG. 1, the tip end of the first plunger 110 includes a plurality of points arranged at equal intervals around an imaginary axis passing through the center of the first plunger 110 in the vertical direction. A shape of the tip end of the first plunger 110 is not limited to the example illustrated in FIG. 1.

The second plunger 120 is positioned on a lower end side of the spring 140. The second plunger 120 is biased by spring 140, downward, i.e., toward a direction away from the first plunger 110. In the state where the inspection target object 20 is inspected by the inspection board 30, the second plunger 120 is connected to the inspection board 30 positioned below the probe 100. In this state, a tip end, i.e., a lower end, of the second plunger 120 contacts with the pad 32 of the inspection board 30. The tip end of the second plunger 120 is a hemispherical shape. A shape of the tip end of the second plunger 120 is not limited to the example illustrated in FIG. 1.

The first plunger 110 includes a material (A). The material (A) includes greater than or equal to 15 mass % and less than or equal to 60 mass % of Pd, greater than or equal to 3 mass % and less than or equal to 79.9 mass % of Cu, and greater than or equal to 0.1 mass % and less than or equal to 75 mass % of at least one of Ni and Pt. For example, at least a surface of the first plunger 110 is formed of the material (A). In this example, for example, the entirety of the first plunger 110 may be formed of the material (A). Alternatively, the surface of the first plunger 110 may be covered with the material (A) by processing such as plating. When the surface of the first plunger 110 is covered with the material (A), a portion of the first plunger 110 covered with the material (A) may be formed of a material different from the material (A). Alternatively, for example, at least a portion of the first plunger 110 in contact with the solder ball 22 may be formed of the material (A). In this example, for example, only a surface of a portion of the first plunger 110 in contact with the solder ball 22 may be covered with the material (A) by processing such as plating.

A lower limit of a mass ratio of Pd included in the material (A) is determined, for example, in terms of corrosion resistance of the material (A). The corrosion resistance of the material (A) tends to become higher as the mass ratio of Pd included in the material (A) becomes higher. In terms of the corrosion resistance of the material (A), the lower limit of the mass ratio of Pd included in the material (A) can be the above-described value. The lower limit of the mass ratio of Pd included in the material (A) may be 17 mass %, 20 mass %, 25 mass %, or 30 mass %, for example.

An upper limit of the mass ratio of Pd included in the material (A) is determined, for example, in terms of suppressing diffusion between a component included in the material (A) and a component included in a solder such as the solder ball 22. If the mass ratio of Pd included in the material (A) were higher than a fixed ratio, sufficiently suppressing the diffusion between the component included in the material (A) and the component included in the solder might become difficult. From these standpoints, the upper limit of the mass ratio of Pd included in the material (A) can be the above-described value. The upper limit of the mass ratio of Pd included in the material (A) may be 55 mass %, 50 mass %, 48 mass %, or 45 mass %, for example.

For example, the mass ratio of Pd included in the material (A) may be greater than or equal to 17 mass % and less than or equal to 55 mass %. Alternatively, for example, the mass ratio of Pd included in the material (A) may be greater than or equal to 20 mass % and less than or equal to 50 mass %.

A lower limit of a mass ratio of Cu included in the material (A) is determined, for example, in terms of hardness of the material (A). An alloy of Pd and Cu may improve hardness of material (A). If, on the other hand, the mass ratio of Cu included in the material (A) were lower than a fixed ratio, securing sufficient hardness of the material (A) might become difficult. In terms of hardness of the material (A), the lower limit of the mass ratio of Cu included in the material (A) can be the above-described value. The lower limit of the mass ratio of Cu included in the material (A) may be 5 mass %, 22 mass %, or 30 mass %, for example.

An upper limit of the mass ratio of Cu included in the material (A) is determined, for example, in terms of corrosion resistance of the material (A). If the mass ratio of Cu included in the material (A) were higher than a fixed ratio, securing sufficient corrosion resistance of the material (A) might become difficult. In terms of the corrosion resistance of the material (A), the upper limit of the mass ratio of Cu included in the material (A) can be the above-described value. The upper limit of the mass ratio of Cu included in the material (A) may be 74 mass % or 65 mass %, for example.

For example, the mass ratio of Cu included in the material (A) is preferably greater than or equal to 5 mass % and less than or equal to 74 mass %.

A lower limit of a mass ratio of at least one of Ni and Pt included in the material (A) is determined, for example, in terms of suppressing a component included in the material (A) from diffusing into a solder such as the solder ball 22. The component included in the material (A) tends to be more suppressed from diffusing into the solder as the mass ratio of at least one of Ni and Pt included in the material (A) becomes higher. In terms of suppressing the component included in the material (A) from diffusing into the solder, the lower limit of the mass ratio of at least one of Ni and Pt included in the material (A) can be the above-described value. The lower limit of the mass ratio of at least one of Ni and Pt included in the material (A) may be 0.3 mass %, 0.5 mass %, or 1 mass %, for example. The mass ratio of at least one of Ni and Pt included in the material (A) when the material (A) includes both of Ni and Pt means, unless otherwise specified, a sum of a mass ratio of Ni included in the material (A) and a mass ratio of Pt included in the material (A).

An upper limit of the mass ratio of at least one of Ni and Pt included in the material (A) is determined, for example, in terms of specific resistance of the material (A). The specific resistance of the material (A) including Ni tends to become higher as the mass ratio of Ni included in the material (A) or a total mass ratio of Ni and Pt becomes higher. Particularly, the specific resistance of the material (A) including Ni becomes higher when the mass ratio of Ni included in the material (A) or the total mass ratio of Ni and Pt exceeds 75 mass %. In terms of the specific resistance of the material (A), the upper limit of the mass ratio of at least one of Ni and Pt included in the material (A) can be the above-described value. The upper limit of the mass ratio of at least one of Ni and Pt included in the material (A) may be 70 mass %, 65 mass %, 30 mass %, or 25 mass %, for example.

For example, the mass ratio of at least one of Ni and Pt included in the material (A) may be greater than or equal to 0.3 mass % and less than or equal to 70 mass %. Alternatively, for example, the mass ratio of at least one of Ni and Pt included in the material (A) may be greater than or equal to 0.5 mass % and less than or equal to 65 mass %.

In the present embodiment, the solder ball 22 is formed of an Sn—Bi based solder. Hardness of the Sn—Bi based solder is relatively low. The hardness of the material (A) of 200 HV or so, for example, is sufficient. The solder ball 22 may be formed of a solder different from the Sn—Bi based solder.

In the present embodiment, a component included in the first plunger 110 can be suppressed from diffusing into the solder ball 22 at an interface between the tip end of the first plunger 110 and the surface of the solder ball 22, as compared to a case where the first plunger 110 includes an alloy formed of Pd, Cu, and Ag without any of Ni or Pt, and a case where the first plunger 110 includes an alloy formed of Pd and Cu without any of Ni or Pt. In the present embodiment, the suppression of diffusion of the component included in the first plunger 110 into the solder ball 22 can suppress consumption of the tip end of the first plunger 110, as compared to the case where the first plunger 110 includes an alloy formed of Pd, Cu, and Ag without any of Ni or Pt, and the case where the first plunger 110 includes an alloy formed of Pd and Cu without any of Ni or Pt.

Hereinafter, an alloy formed of Pd, Cu, and Ag without any of Ni or Pt is referred to as a PdCuAg alloy as necessary. An alloy formed of Pd and Cu without any of Ni or Pt is referred to as a PdCu alloy as necessary. The PdCuAg alloy is widely and commonly used for a semiconductor inspection probe.

The reason that the diffusion of the component included in the material (A) into the solder is suppressed when using the material (A) as compared to a case of using the PdCuAg alloy or the PdCu alloy is presumed to be as follows. That is, when the material (A) and the solder contact with each other, a dense thin film including a metal compound such as Sn—Ni or Sn—Pt is formed at an interface between the material (A) and the solder, due to at least one of Ni and Pt included in the material (A). The metal compound suppresses diffusion of components included in the material (A) and the solder when the metal compound exists at the interface between the material (A) and the solder, as compared to a case where the metal compound does not exist at the interface between the material (A) and the solder. If, on the other hand, the PdCuAg alloy or the PdCu alloy is used, it would not be likely that the metal compound is formed. In the present embodiment, accordingly, the diffusion of the component included in the first plunger 110 into the solder ball 22 can be suppressed between the tip end of the first plunger 110 and the solder ball 22 as compared to a case where the first plunger 110 includes the PdCuAg alloy or the PdCu alloy.

Figure 2:
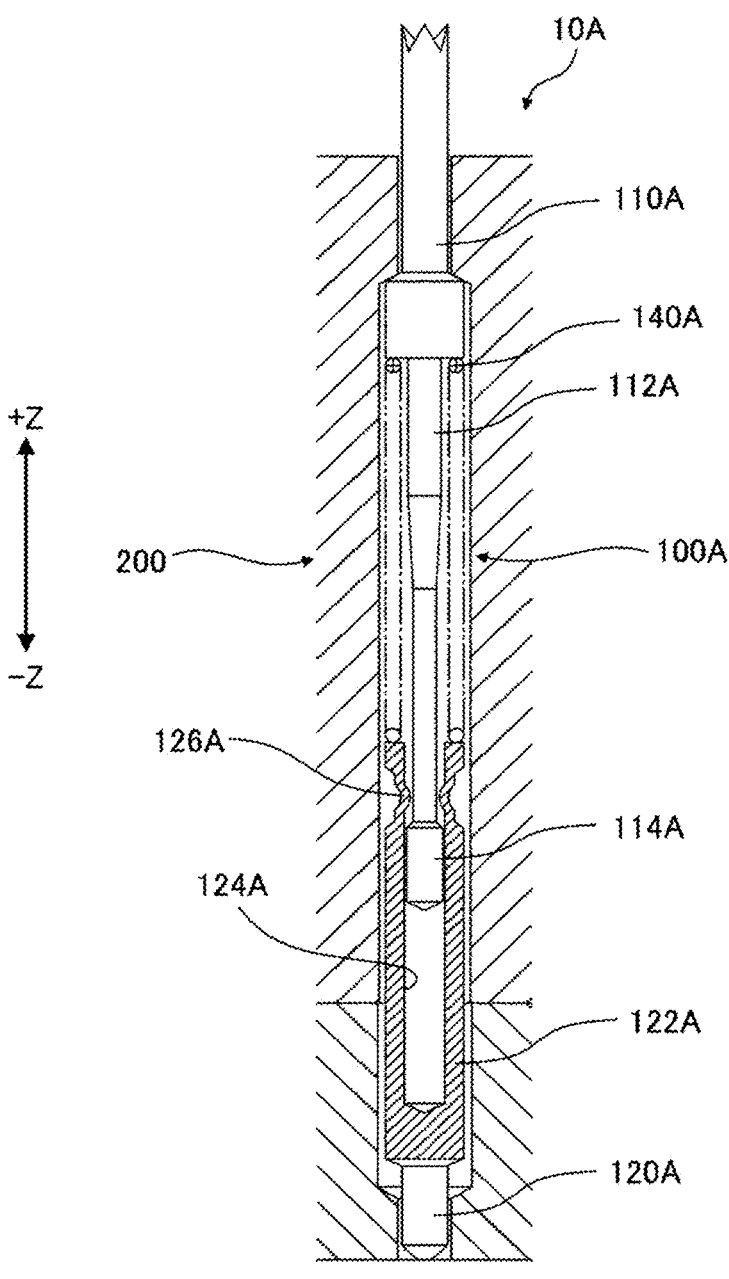
FIG. 2 A sectional view of a socket according to a first variant.

FIG. 2 is a sectional view of a socket 10A according to a first variant. The socket 10A according to the present variant is similar to the probe 100 according to the embodiment, except for a following point.

An extension portion 112A extending toward a lower side of a first plunger 110A is provided at a lower end of a first plunger 110A. The first plunger 110A and the extension portion 112A are integrated with each other. Accordingly, both of the first plunger 110A and the extension portion 112A include the material (A). A tip end head 114A is provided at a lower end of the extension portion 112A. The tip end head 114A may include the material (A), or may not include the material (A).

A base end portion 122A is provided at an upper end of a second plunger 120A. A hole 124A open upward of the base end portion 122A is formed on an upper surface of the base end portion 122A. A locking portion 126A is provided on a part of an inner wall of the base end portion 122A defining the hole 124A. A horizontal-direction diameter of the locking portion 126A in the hole 124A is smaller than a horizontal-direction diameter of a part of the hole 124A positioned below the locking portion 126A. The tip end head 114A enters the hole 124A on a lower side of the locking portion 126A. The tip end head 114A is movable in the vertical direction in the hole 124A on the lower side of the locking portion 126A. A horizontal-direction diameter of the tip end head 114A is larger than a horizontal-direction diameter of the hole 124A at the locking portion 126A. Accordingly, the locking portion 126A prevents the tip end head 114A from being detached toward an upper side of the hole 124A.

The probe 100A according to the present variant does not have a tube corresponding to the tube 130 of the probe 100 according to the embodiment. A spring 140A is positioned between the lower end of the first plunger 110A and an upper end of the base end portion 122A. The spring 140A is spirally wound around the extension portion 112A. The first plunger 110A, the extension portion 112A, and the tip end head 114A are biased upward by the spring 140A. The second plunger 120A and the base end portion 122A are biased downward by the spring 140A.

7

Figure 3:
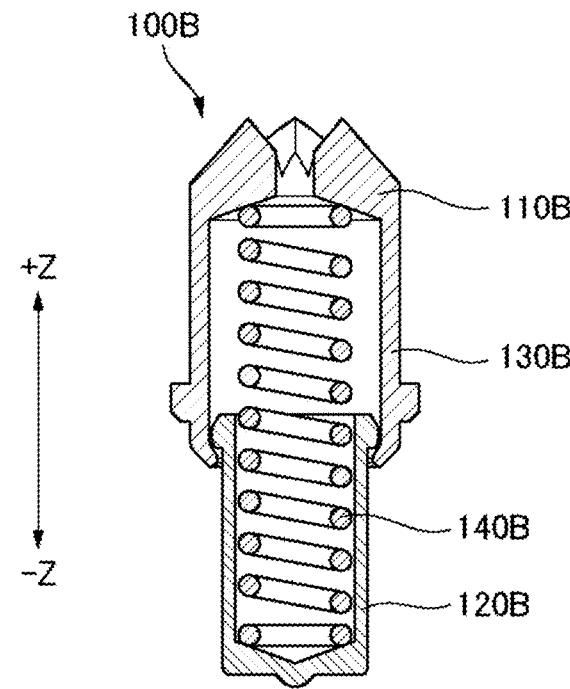
FIG. 3 A sectional view of a probe according to a second variant.

FIG. 3 is a sectional view of a probe 100B according to a second variant. The probe 100B according to the present variant is similar to the probe 100 according to the embodiment, except for a following point.

In the example illustrated in FIG. 3, a first plunger 110B and a tube 130B are integrated with each other. Accordingly, both of the first plunger 110B and the tube 130B include the material (A). The first plunger 110B and the tube 130B are biased by a spring 140B upward, i.e., toward a direction away from a second plunger 120B. The second plunger 120B is biased by the spring 140B downward, i.e., toward a direction away from the first plunger 110B.

Although the embodiment and the variants of the present invention are described above with reference to the drawings, these are exemplifications of the present invention, and various configurations other than those described above may be employed.

Example

One aspect of the present invention will be described based on examples and comparative examples. The present invention is not limited to the following each example.

Table 1 is a table indicating composition (unit: mass %) of Pd, Cu, Ni, Pt, Ag, and In included in a test material of each of examples 1 to 20 and comparative examples 1 to 3.

TABLE 1

| | Composition (mass %) | | | | | |
|---|---|---|---|---|---|---|
| | Pd | Cu | Ni | Pt | Ag | In |
| Example 1 | 48 | 22 | 30 | 0 | 0 | 0 |
| Example 2 | 45 | 30 | 25 | 0 | 0 | 0 |
| Example 3 | 45 | 45 | 10 | 0 | 0 | 0 |
| Example 4 | 45 | 50 | 5 | 0 | 0 | 0 |
| Example 5 | 35 | 45 | 20 | 0 | 0 | 0 |
| Example 6 | 35 | 55 | 10 | 0 | 0 | 0 |
| Example 7 | 35 | 64 | 1 | 0 | 0 | 0 |
| Example 8 | 35 | 64.5 | 0.5 | 0 | 0 | 0 |
| Example 9 | 30 | 40 | 30 | 0 | 0 | 0 |
| Example 10 | 25 | 65 | 10 | 0 | 0 | 0 |
| Example 11 | 25 | 74 | 1 | 0 | 0 | 0 |
| Example 12 | 45 | 30 | 0 | 25 | 0 | 0 |
| Example 13 | 45 | 5 | 0 | 50 | 0 | 0 |
| Example 14 | 45 | 40 | 10 | 5 | 0 | 0 |
| Example 15 | 45 | 20 | 30 | 5 | 0 | 0 |
| Example 16 | 45 | 5 | 25 | 25 | 0 | 0 |
| Example 17 | 25 | 73 | 1 | 1 | 0 | 0 |
| Example 18 | 25 | 60 | 10 | 5 | 0 | 0 |
| Example 19 | 20 | 10 | 10 | 60 | 0 | 0 |
| Example 20 | 25 | 25 | 5 | 45 | 0 | 0 |
| Comparative Example 1 | 45 | 30 | 0 | 0 | 24.5 | 0.5 |
| Comparative Example 2 | 45 | 55 | 0 | 0 | 0 | 0 |
| Comparative Example 3 | 75 | 15 | 10 | 0 | 0 | 0 |

Each of the test materials of the examples 1 to 20 and the comparative examples 1 to 3 were prepared as follows.

Regarding the example 1, as indicated in Table 1, 48 mass % Pd, 22 mass % Cu, and 30 mass % Ni were mixed to provide a mixture. Also regarding each of the examples 2 to 20 and the comparative examples 1 to 3, Pd, Cu, Ni, Pt, Ag, and In were mixed to provide mixtures in accordance with the composition of the examples 2 to 20 and the comparative examples 1 to 3 indicated in Table 1. A numerical value "0" in Table 1 means that metal associated to "0" is not mixed.

Next, regarding each of the examples 1 to 20 and the comparative examples 1 to 3, the mixture was melted to form an alloy ingot by arc melting in an argon atmosphere.

Next, regarding each of the examples 1 to 20 and the comparative examples 1 to 3, rolling and heat treatment of the alloy ingot was repeated to form two types of plate materials of a plate material having rolling ratio of 75% and a plate material having rolling ratio of 90%. A rolling ratio RR is determined according to the following equation (1), where t1 is a thickness of the alloy ingot before the rolling, and t2 is the thickness of the alloy ingot after the rolling.

$$RR=(t1-t2)/t1 \tag{1}$$

Table 2 is a table indicating measurement results of specific resistance of the test material, hardness of the test material, and a thickness of a diffusion layer between the test material and a solder for each of the examples 1 to 20 and the comparative examples 1 to 3.

TABLE 2

| | Specific Resistance ($\mu\Omega \cdot cm$) | Hardness (HV) | Thickness of Diffusion layer ($\mu m$) |
|---|---|---|---|
| Example 1 | 50 | 340 | 10 |
| Example 2 | 60 | 300 | 10 |
| Example 3 | 30 | 290 | 20 |
| Example 4 | 20 | 280 | 20 |
| Example 5 | 50 | 280 | 20 |
| Example 6 | 20 | 270 | 20 |
| Example 7 | 20 | 250 | 20 |
| Example 8 | 20 | 240 | 70 |
| Example 9 | 60 | 300 | 10 |
| Example 10 | 20 | 240 | 20 |
| Example 11 | 20 | 210 | 20 |
| Example 12 | 70 | 280 | 190 |
| Example 13 | 50 | 250 | 80 |
| Example 14 | 50 | 280 | 20 |
| Example 15 | 50 | 340 | 10 |
| Example 16 | 40 | 380 | 10 |
| Example 17 | 20 | 210 | 60 |
| Example 18 | 30 | 250 | 20 |
| Example 19 | 60 | 390 | 10 |
| Example 20 | 70 | 330 | 10 |
| Comparative Example 1 | 20 | 350 | 600 |
| Comparative Example 2 | 20 | 270 | 800 |
| Comparative Example 3 | 40 | 290 | 800 |

Regarding each of the examples 1 to 20 and the comparative examples 1 to 3, the specific resistance of the test material was measured by measuring electrical resistance R of the test material at a room temperature, and computing specific resistance ρ according to the following equation (2).

$$\rho=RS/l \tag{2}$$

Herein, l is a length of the test material in a direction in which current flows, and S is a cross-sectional area of the test material perpendicular to the direction in which current flows. In the measurement of the specific resistance, the plate material having rolling ratio of 90% was used as the test material.

Regarding each of the examples 1 to 20 and the comparative examples 1 to 3, the hardness of the test material was measured, with a micro Vickers hardness tester, by applying, for 10 seconds, a load of 200 gf to a center of a surface of the test material when viewed in a direction parallel to a thickness direction of the test material. In the measurement of the hardness, the plate material having rolling ratio of 75% was used as the test material.

Regarding each of the examples 1 to 20 and the comparative examples 1 to 3, the thickness of the diffusion layer between the test material and the solder was measured as follows. First, an Sn—Bi based solder was placed on the test material. Next, while the Sn—Bi based solder was placed on the test material, the test material and the Sn—Bi based solder were heat-treated at 250° C. in a N$_2$ atmosphere for 1 hour to melt the solder on the test material. Next, the test material was embedded in resin, and a section including both of the test material and the solder was made exposed. Next, by using an electron probe micro analyzer (EPMA), a linear analysis was performed on an interface between the test material and the solder in a direction perpendicular to a surface of the test material on which the solder was placed. The diffusion layer was regarded as a layer in which both Sn diffusing from the solder and Pd diffusing from a test piece exist. The thickness of the diffusion layer was measured from a measurement result of the EPMA. In the measurement of the thickness of the diffusion layer, the plate material having rolling ratio of 75% was used as the test material.

As indicated in Table 2, in the examples 1 to 20, the specific resistances were in a range of 20 μΩ·cm to 70 μΩ·cm. In the comparative examples 1 to 3, on the other hand, the specific resistances were 20 μΩ·cm to 40 μΩ·cm. A comparison between the examples 1 to 20 and the comparative examples 1 to 3 indicate that specific resistance when the test material includes at least one of Ni and Pt would not be significantly higher than specific resistance when the test material is the PdCuAg alloy or the PdCu alloy.

Figure 4:
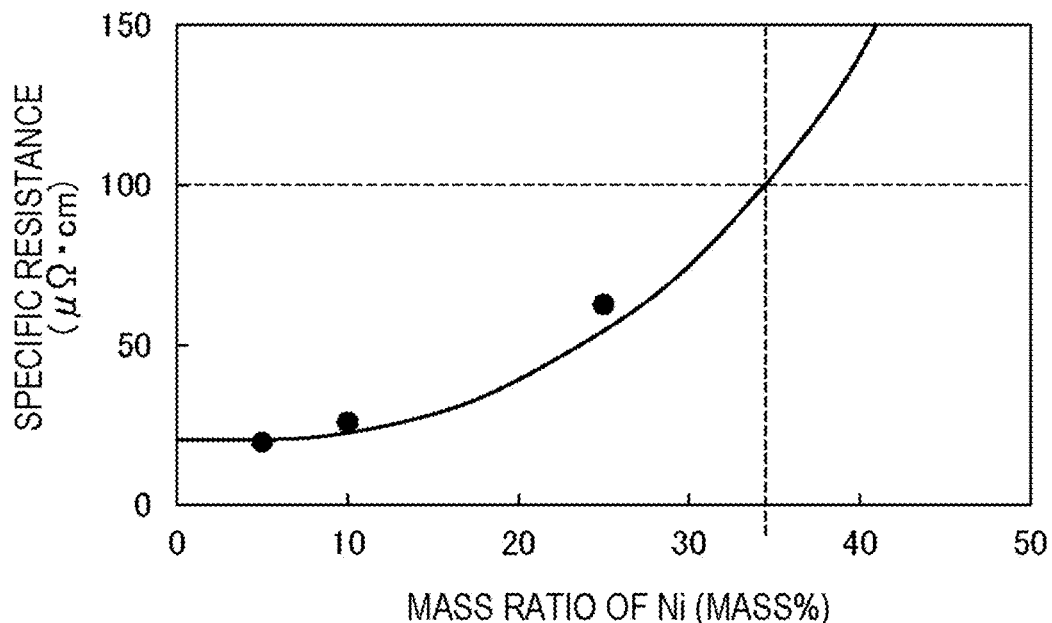
FIG. 4 A graph illustrating a relation between a mass ratio of Ni included in a test material and a specific resistance of the test material for examples 2 to 4 where a mass ratio of Pd included in the test material is 45 mass %.

FIG. 4 is a graph illustrating a relation between a mass ratio of Ni included in the test material and specific resistance of the test material for the examples 2 to 4 where a mass ratio of Pd included in the test material is 45 mass %.

In FIG. 4, a horizontal axis of the graph indicates the mass ratio (unit: mass %) of Ni included in the test material. A vertical axis of the graph indicates the specific resistance (unit: μΩ·cm) of the test material.

Circle plots in FIG. 4 indicate plots of the examples 2 to 4. A solid-line curve in FIG. 4 is a curve estimated from a tendency of the plots of the examples 2 to 4.

As illustrated in FIG. 4, there is a tendency that the specific resistance of the test material becomes higher as the mass ratio of Ni included in the test material becomes higher. In terms of suppressing the specific resistance of the test material to less than or equal to 100 μΩ·cm, it is likely that the mass ratio of Ni included in the test material needs to be less than or equal to 35 mass %.

As indicated in Table 2, in the examples 1 to 20, hardness was in a range of 210 HV to 390 HV. In the comparative examples 1 to 3, on the other hand, hardness was in a range of 270 HV to 350 HV. A comparison between the examples 1 to 20 and the comparative examples 1 to 3 indicates that hardness when the test material includes at least one of Ni and Pt could be almost equivalent to hardness when the test material is the PdCuAg alloy or the PdCu alloy.

Figure 5:
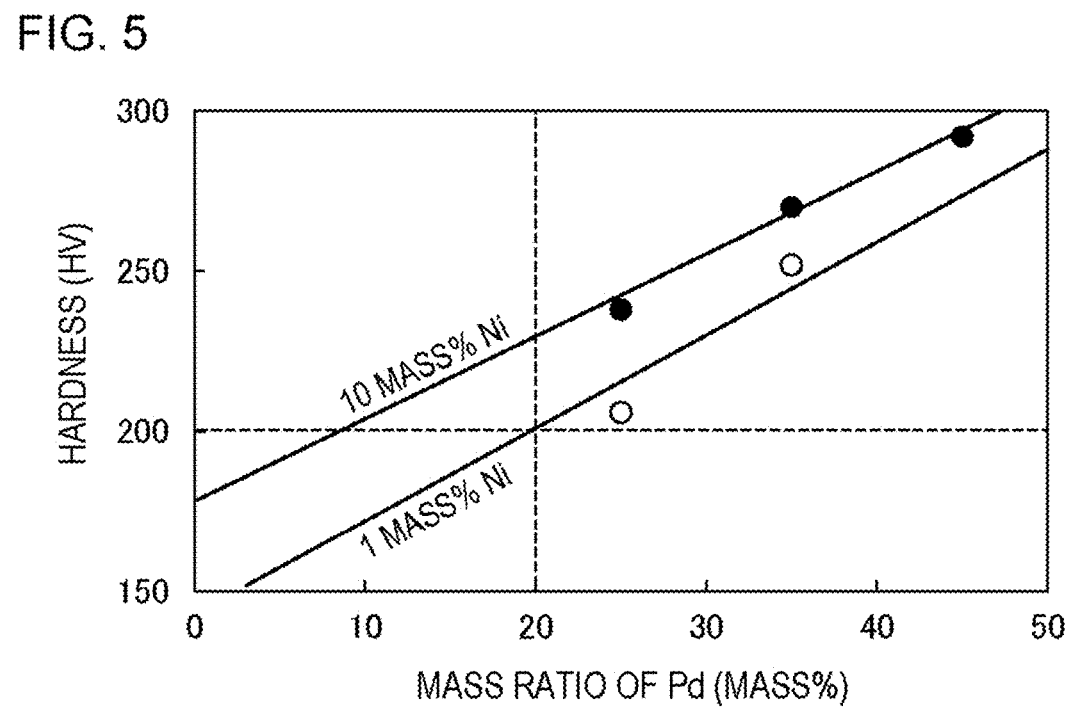

FIG. 5 is a graph illustrating a relation between the mass ratio of Pd included in the test material and hardness of the test material for the examples 3, 6, and 10 where the mass ratio of Ni included in the test material is 10 mass % and the examples 7 and 11 where the mass ratio of Ni included in the test material is 1 mass %.

In FIG. 5, the horizontal axis of the graph indicates the mass ratio (unit: mass %) of Pd included in the test material. The vertical axis of the graph indicates the hardness (unit: HV) of the test material.

Black circle plots in FIG. 5 indicate plots of the examples 3, 6, and 10. White circle plots in FIG. 5 indicate the plots of the examples 7 and 11. A straight line labeled "10 mass % Ni" in FIG. 5 is a straight line estimated from a tendency of the plots of the examples 3, 6, and 10. The straight line labeled "1 mass % Ni" in FIG. 5 is a straight line estimated from a tendency of the plots of the examples 7 and 11.

As illustrated in FIG. 5, when the mass ratio of Ni included in the test material is constant, there is a tendency that the hardness of the test material becomes higher as the mass ratio of Pd included in the test material becomes higher. When the mass ratio of Pd included in the test material is constant, there is a tendency that the hardness of the test material becomes higher as the mass ratio of Ni included in the test material becomes higher. In terms of maintaining the hardness of the test material at greater than or equal to 200 HV when the mass ratio of Ni included in the test material is 1 mass %, it is likely that the mass ratio of Pd included in the test material needs to be greater than or equal to 20 mass %.

As indicated in Table 2, in any of the examples 1 to 20, the thickness of the diffusion layer was less than or equal to 200 μm. Particularly, in the examples 1 to 11 where the test material includes Ni without Pt, the thickness of the diffusion layer was less than or equal to 70 μm. In the comparative examples 1 to 3, on the other hand, the thickness of the diffusion layer was greater than 200 μm. A comparison between the examples 1 to 20 and the comparative examples 1 to 3 indicates that the diffusion of the component included in the test material into the solder can be suppressed when the test material includes at least one of Ni and Pt, as compared to the case where the test material is the PdCuAg alloy or the PdCu alloy.

Figure 6:
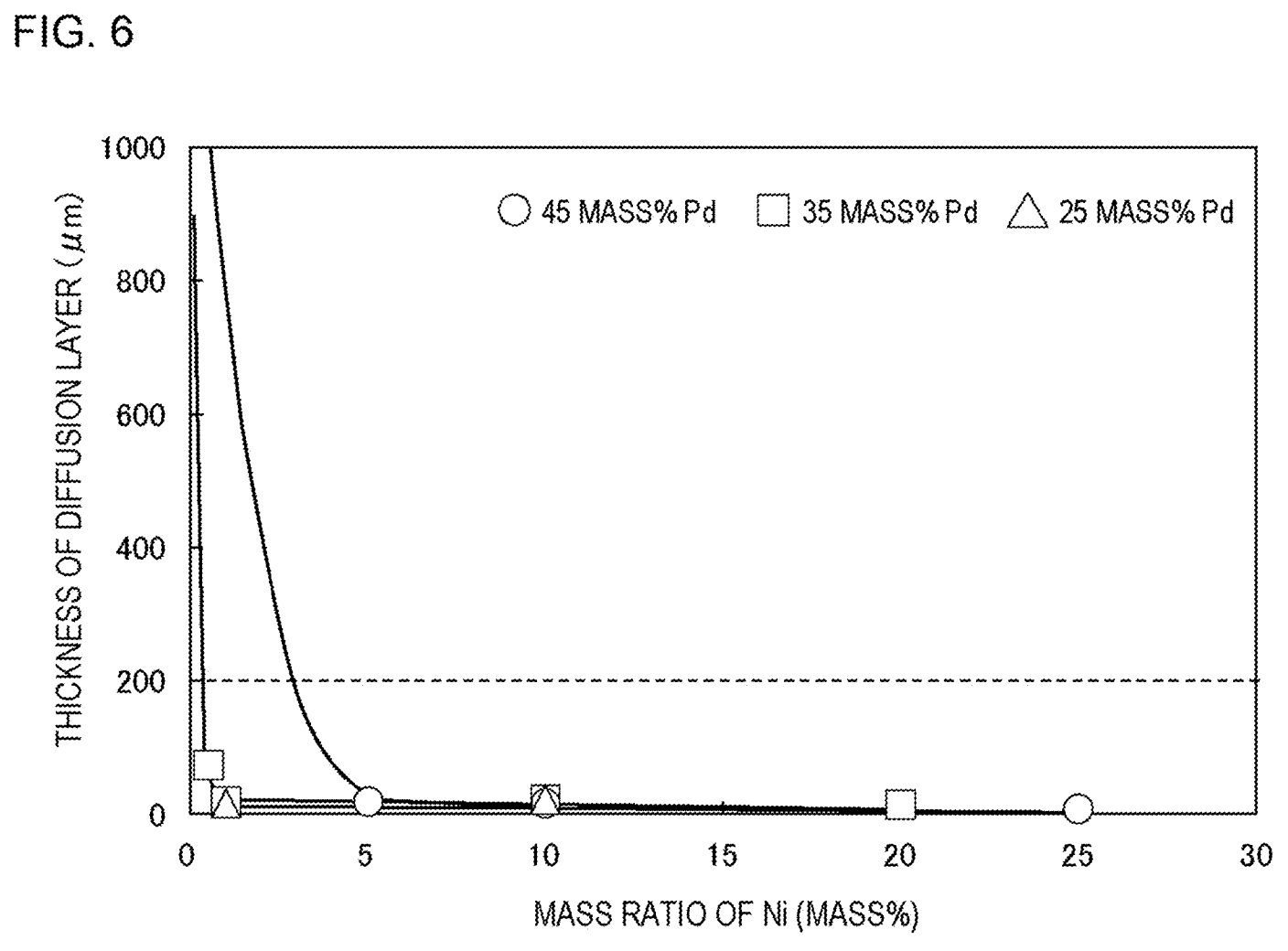
Figure 7:
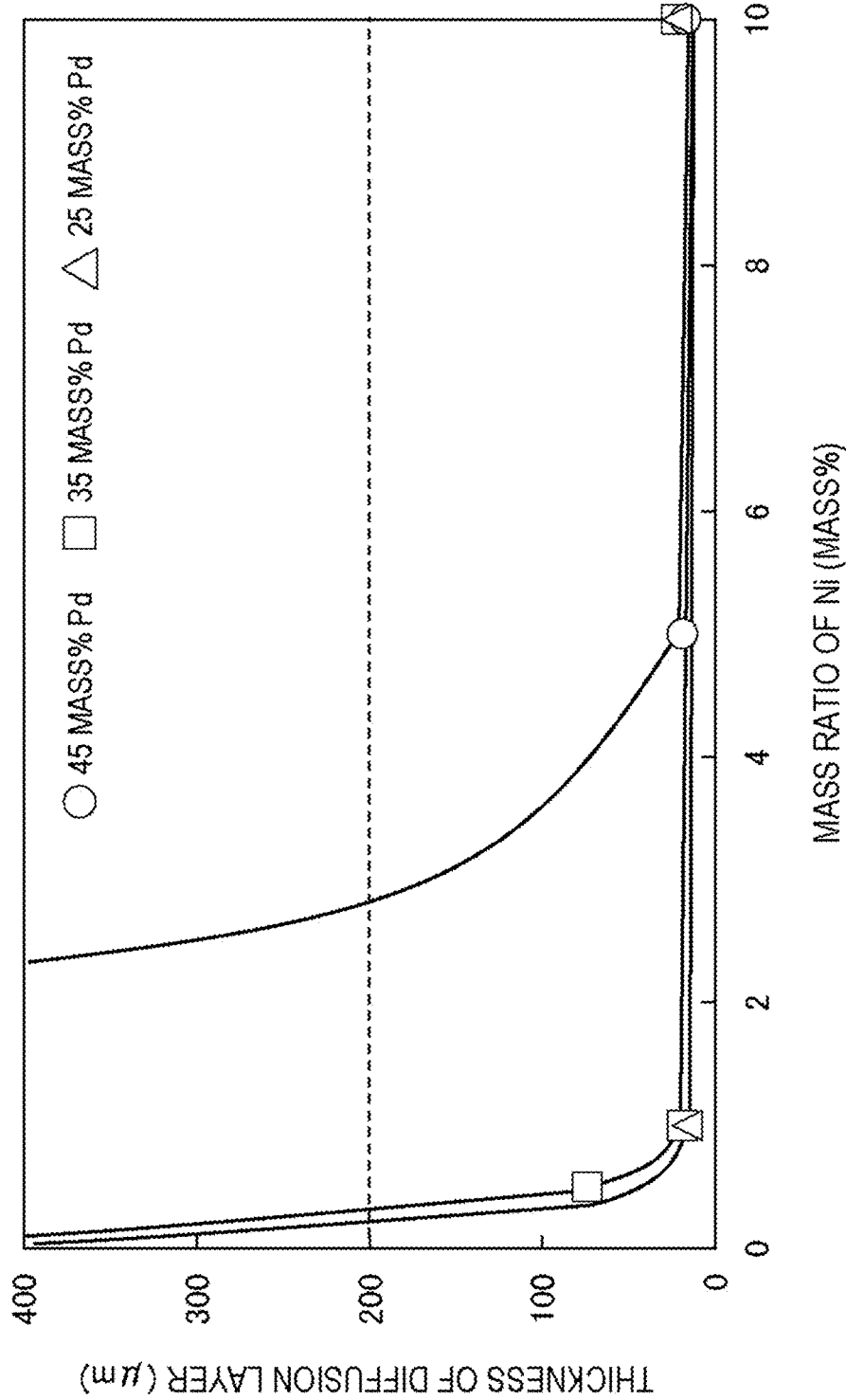
FIG. 7 An enlarged graph of a part of the graph illustrated in FIG. 6.

FIG. 6 is a graph illustrating a relation between the mass ratio of Ni included in the test material and the thickness of the diffusion layer between the test material and the solder for the examples 2 to 4 where the mass ratio of Pd included in the test material is 45 mass %, the examples 5 to 8 where the mass ratio of Pd included in the test material is 35 mass %, and the examples 10 to 11 where the mass ratio of Pd included in the test material is 25 mass %. FIG. 7 is an enlarged graph of a part of the graph illustrated in FIG. 6.

In FIGS. 6 and 7, the horizontal axis of the graph indicates the mass ratio (unit: mass %) of Ni included in the test material. The vertical axis of the graph indicates the thickness (unit: μm) of the diffusion layer between the test material and the solder.

Circle plots in FIGS. 6 and 7 indicate plots of the examples 2 to 4 where the mass ratio of Pd included in the test material is 45 mass %. Square plots in FIGS. 6 and 7 indicate plots of the examples 5 to 8 where the mass ratio of Pd included in the test material is 35 mass %. Triangle plots in FIGS. 6 and 7 indicate plots of the examples 10 to 11 where the mass ratio of Pd included in the test material is 25 mass %.

A curve attached to the circle plots for which the mass ratio of Pd included in the test material is 45 mass %, a curve attached to the square plots for which the mass ratio of Pd included in the test material is 35 mass %, and a curve attached to the triangle plots for which the mass ratio of Pd included in the test material is 25 mass % are curves estimated from a tendency of the plots for which the mass ratio of Pd included in the test material is 35 mass %.

As illustrated in FIGS. 6 and 7, when the mass ratio of Pd included in the test material is constant, there is a tendency that the thickness of the diffusion layer becomes larger as the mass ratio of Ni included in the test material becomes lower. When the mass ratio of Ni included in the test material is constant, there is a tendency that the thickness of the diffusion layer becomes larger as the mass ratio of Pd included in the test material becomes higher. In terms of suppressing the thickness of the diffusion layer to less than or equal to 200 μm when the mass ratio of Pd included in the test material is 25 mass %, it is likely that the mass ratio of Ni included in the test material needs to be greater than or equal to 0.1 mass %. In terms of suppressing the thickness of the diffusion layer to less than or equal to 200 μm when the mass ratio of Pd included in the test material is 35 mass %, it is likely that the mass ratio of Ni included in the test material needs to be greater than or equal to 0.5 mass %. In terms of suppressing the thickness of the diffusion layer to less than or equal to 200 μm when the mass ratio of Pd included in the test material is 45 mass %, it is likely that the mass ratio of Ni included in the test material needs to be greater than or equal to 3 mass %.

Figure 8:
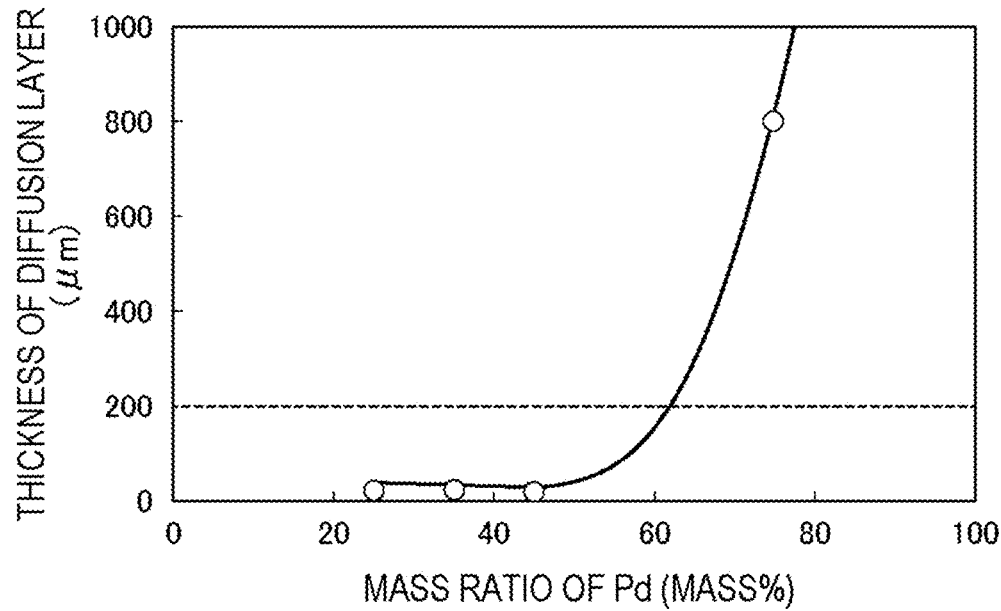
FIG. 8 A graph illustrating a relation between a mass ratio of Pd included in the test material and a thickness of the diffusion layer between the test material and the solder for the examples 3, 6, and 10 and a comparative example 3 where the test material includes 10 mass % of Ni without Pt.

FIG. 8 is a graph illustrating a relation between the mass ratio of Pd included in the test material and the thickness of the diffusion layer between the test material and the solder for the examples 3, 6, and 10 and the comparative example 3 where the test material includes 10 mass % Ni without Pt.

In FIG. 8, the horizontal axis of the graph indicates the mass ratio (unit: mass %) of Pd included in the test material. The vertical axis of the graph indicates the thickness (unit: μm) of the diffusion layer between the test material and the solder.

Circle plots in FIG. 8 indicate plots of the examples 3, 6, and 10 and the comparative example 3 where the test material includes 10 mass % Ni without Pt. A curve attached to the circle plots is a curve estimated from a tendency of the plots.

As illustrated in FIG. 8, when the test material includes a constant mass ratio of Ni without Pt, there is a tendency that the thickness of the diffusion layer becomes larger as the mass ratio of Pd included in the test material becomes higher. In terms of suppressing the thickness of the diffusion layer to less than or equal to 200 μm when the test material includes 10 mass % Ni without Pt, it is likely that the mass ratio of Pd included in the test material needs to be less than or equal to 60 mass %.

Figure 9:
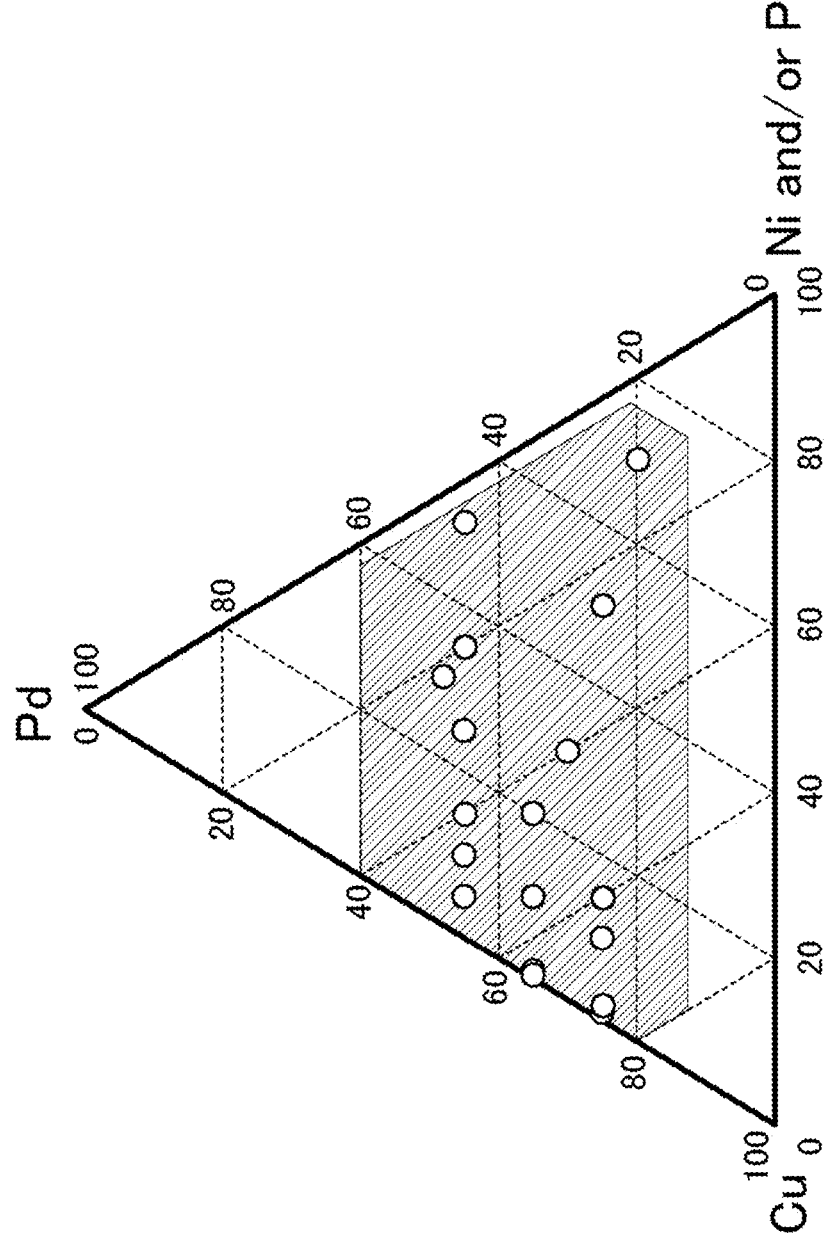
FIG. 9 A ternary graph illustrating a relation among a mass ratio of Pd included in the test material, a mass ratio of Cu included in the test material, and a mass ratio of at least one of Ni and Pt included in the test material.

FIG. 9 is a ternary graph illustrating a relation among the mass ratio of Pd included in the test material, the mass ratio of Cu included in the test material, and the mass ratio of at least one of Ni and Pt included in the test material.

A side from a right lower vertex to a central upper vertex in the ternary graph indicates the mass ratio (unit: mass %) of Pd included in the test material. A side from the central upper vertex to a left lower vertex of the ternary graph indicates the mass ratio (unit: mass %) of Cu included in the test material. A side from the left lower vertex to the right lower vertex of the ternary graph indicates the mass ratio (unit: mass %) of at least one of Ni and Pt included in the test material.

A hatched region in the ternary graph in FIG. 9 indicates a range where the mass ratio of Pd is greater than or equal to 15 mass % and less than or equal to 60 mass %, the mass ratio of Cu is greater than or equal to than 3 mass % and less than or equal to 79.9 mass %, and the mass ratio of at least one of Ni and Pt is greater than or equal to 0.1 mass % and less than or equal to 75 mass %. Plots of the examples 1 to 20 are positioned within the hatched region. A tendency of the plots of the examples 1 to 20 indicates that the diffusion of the component included in the test material into the solder can be suppressed at any of the hatched region, as compared to the case where the test material is the PdCuAg alloy or the PdCu alloy.

A first test pin including the test material of the example 2, a second test pin including the test material of the example 12, and a third test pin including the test material of the comparative example 1 were prepared to evaluate consumption of the tip end of the plunger when the plunger and a solder are energized continuously in time.

Figure 10:
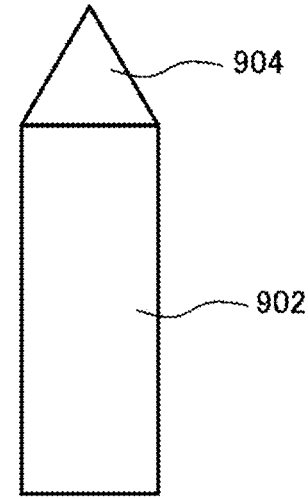
FIG. 10 A side view of a first test pin, a second test pin, and a third test pin.

FIG. 10 is a side view of the first test pin, the second test pin, and the third test pin. A shape of the first test pin, the second test pin, and the third test pin will be described with reference to FIG. 10.

Each of the test pins includes a column portion 902 and a contact portion 904. The column portion 902 has a cylindrical shape. The contact portion 904 is provided at one end of the column portion 902. The contact portion 904 has a conical shape including a tip end of a substantially sharp hemispherical shape having a radius of 0.05 mm.

As a continuous energization test of the first test pin, the second test pin, and the third test pin, 1 A current was flown while the tip end of the contact portion of each of the test pins was brought into contact with a bar-shaped Sn-40Bi solder continuously for 72 hours at a temperature of 120° C. The tip end of each of the test pins after the continuous energization test was observed with a scanning electron microscope (SEM).

Figure 11:
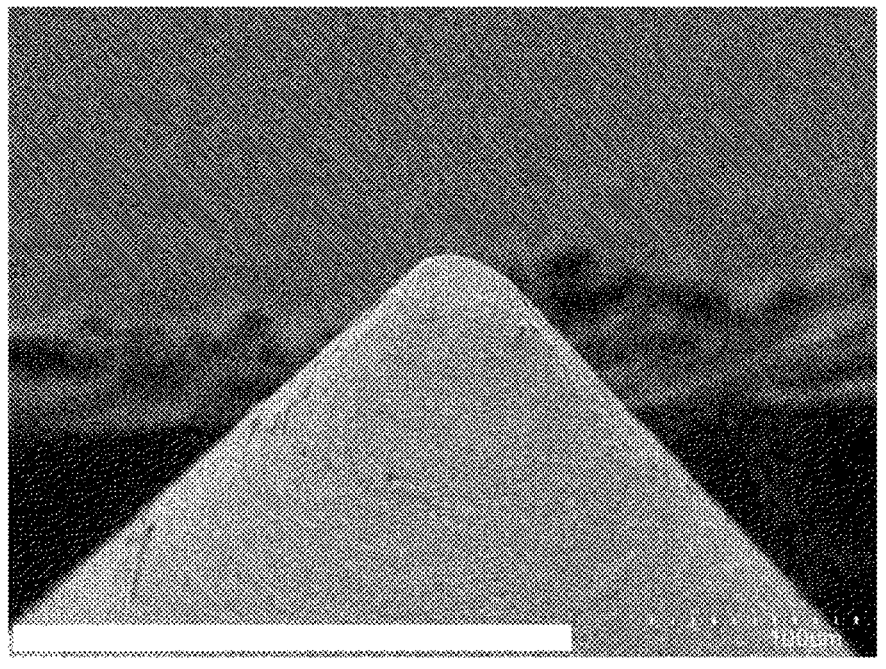
FIG. 11 A diagram illustrating a SEM image of a tip end of a contact portion of the first test pin after a continuous energization test.
Figure 12:
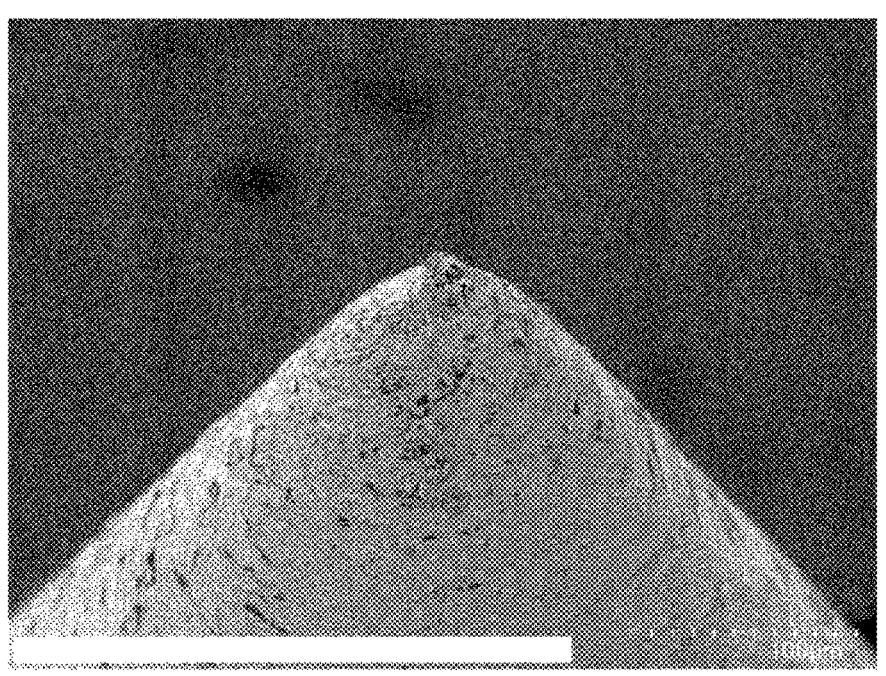
FIG. 12 A diagram illustrating a SEM image of a tip end of a contact portion of the second test pin after the continuous energization test.
Figure 13:
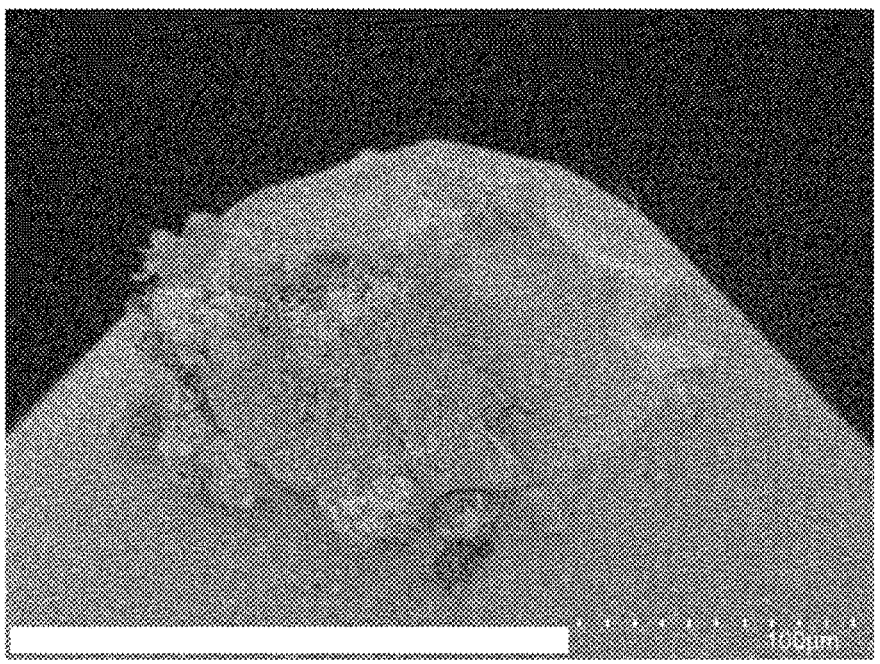
FIG. 13 A diagram illustrating a SEM image of a tip end of a contact portion of the third test pin after the continuous energization test.

FIG. 11 is a diagram illustrating a SEM image of the tip end of the contact portion of the first test pin after the continuous energization test. FIG. 12 is a diagram illustrating a SEM image of the tip end of the contact portion of the second test pin after the continuous energization test. FIG. 13 is a diagram illustrating a SEM image of the tip end of the contact portion of the third test pin after the continuous energization test.

As illustrated in FIG. 11, little consumption of the tip end of the contact portion was generated in the first test pin relative to the second test pin and the third test pin.

As illustrated in FIG. 12, the consumption of the tip end of the contact portion was suppressed in the second test pin relative to the third test pin.

As illustrated in FIG. 13, the consumption of the tip end of the contact portion was greater in the third test pin than in the first test pin and the second test pin.

The above-described results indicates that the consumption of the tip end of the plunger when energizing the plunger and the solder continuously in time can be suppressed when the plunger includes at least one of Ni and Pt as compared to a case where the plunger includes the PdCuAg alloy.

A fourth test pin including the test material of the example 2, a fifth test pin including the test material of the example 12, and a sixth test pin including the test material of the comparative example 1 were prepared to evaluate wear of the tip end of the plunger when the plunger and the solder are repeatedly energized.

A shape of the fourth test pin, the fifth test pin, and the sixth test pin was the same as that of the first test pin, the second test pin, and the third test pin, except for a shape of the contact portion. A tip end of the contact portion of the fourth test pin, the fifth test pin, and the sixth test pin includes four points arranged at equal intervals around a central axis of the test pin.

As an energization durability test of the fourth test pin, the fifth test pin, and the sixth test pin, contacting the tip end of the contact portion of the test pin with a bar-shaped Sn-40Bi solder and flowing 2 A current for 20 ms at a temperature of 125° C. are repeated 10,000 times using a flying probe tester. Contact resistance of the test pin was measured at each time of the 10,000 times.

Figure 14:
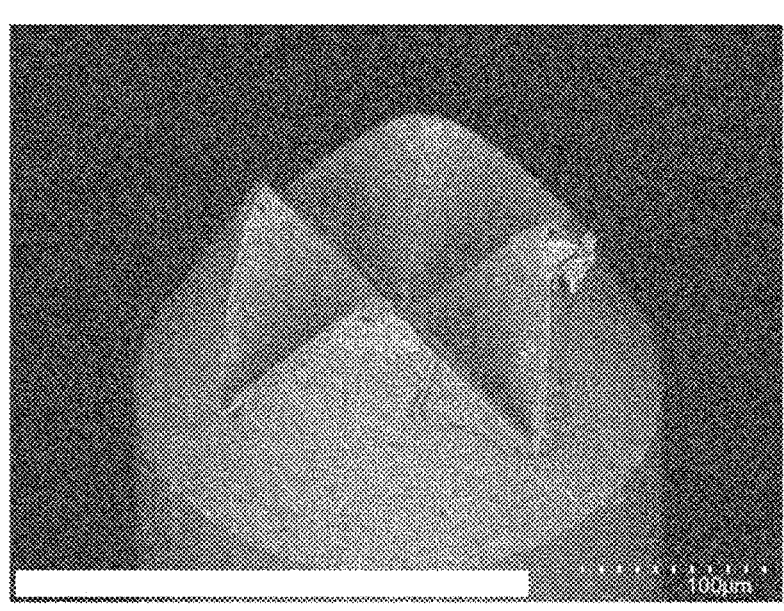
FIG. 14 A diagram illustrating a SEM image of a tip end of a contact portion of a fourth test pin after an energization durability test.
Figure 15:
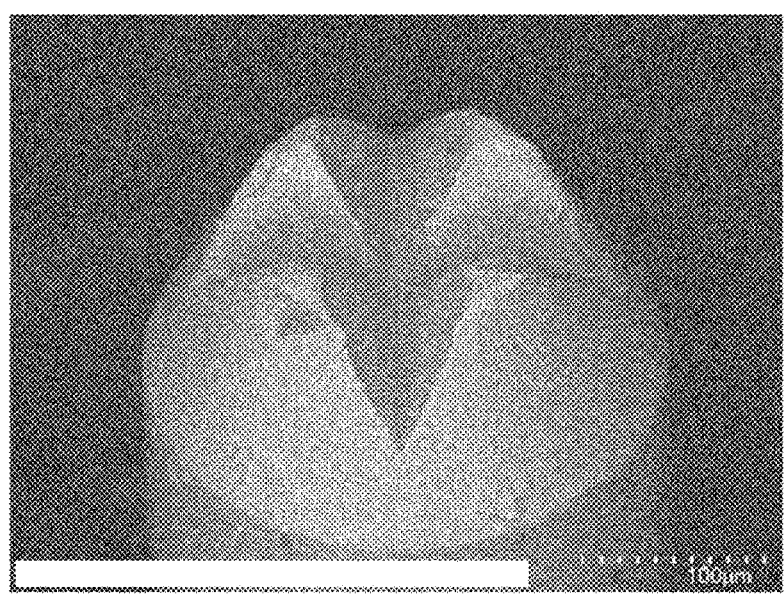
FIG. 15 A diagram illustrating a SEM image of a tip end of a contact portion of a fifth test pin after the energization durability test.
Figure 16:
FIG. 16 A diagram illustrating a SEM image of a tip end of a contact portion of a sixth test pin after the energization durability test.

FIG. 14 is a diagram illustrating a SEM image of the tip end of the contact portion of the fourth test pin after the energization durability test. FIG. 15 is a diagram illustrating a SEM image of the tip end of the contact portion of the fifth test pin after the energization durability test. FIG. 16 is a diagram illustrating a SEM image of the tip end of the contact portion of the sixth test pin after the energization durability test.

As illustrated in FIG. 14, little wear of the tip end of the contact portion was generated in the fourth test pin relative to the fifth test pin and the sixth test pin.

A length dimension of the tip end of the contact portion of the fourth test pin after the energization durability test was decreased by 2.5 μm from a length dimension of the tip end of the contact portion of the fourth test pin before the energization durability test. An average of the contact resistance of the fourth test pin over the 10,000 times of the energization durability test was 36.6 mΩ.

As illustrated in FIG. 15, the wear of the tip end of the contact portion was suppressed in the fifth test pin relative to the sixth test pin.

A length dimension of the tip end of the contact portion of the fifth test pin after the energization durability test was decreased by 12.4 μm from a length dimension of the tip end of the contact portion of the fifth test pin before the energization durability test. An average of the contact resistance of the fifth test pin over the 10,000 times of the energization durability test was 38.4 mΩ.

As illustrated in FIG. 16, the wear of the tip end of the contact portion was greater in the sixth test pin than in the fourth test pin and the fifth test pin.

A length dimension of the tip end of the contact portion of the sixth test pin after the energization durability test was decreased by 17.4 μm from a length dimension of the tip end of the contact portion of the sixth test pin before the energization durability test. An average of the contact resistance of the sixth test pin over the 10,000 times of the energization durability test was 34.6 mΩ.

The above-described results indicate that the wear of the tip end of the plunger when repeatedly energizing the plunger and the solder can be suppressed when the plunger includes at least one of Ni and Pt as compared to the case where the plunger includes the PdCuAg alloy. When the plunger and the solder are repeatedly energized, the contact resistance when the plunger includes at least one of Ni and Pt can be substantially equivalent to a contact resistance when the plunger includes the PdCuAg alloy.

According to the present description, the following aspect is provided.

(Aspect 1)

An aspect 1 is a probe including:

greater than or equal to 15 mass % and less than or equal to 60 mass % of Pd;

greater than or equal to 3 mass % and less than or equal to 79.9 mass % of Cu; and greater than or equal to 0.1 mass % and less than or equal to 75 mass % of at least one of Ni and Pt.

According to the aspect 1, the diffusion of a component included in the probe into a solder can be suppressed at an interface between the probe and the solder, as compared to a case where the probe includes an alloy formed of Pd, Cu, and Ag without any of Ni or Pt, and a case where the probe includes an alloy formed of Pd and Cu without any of Ni or Pt.

This application claims priority based on Japanese patent application No. 2021-53184 filed on Mar. 26, 2021 and Japanese patent application No. 2022-19334 filed on Feb. 10, 2022, the disclosure of which is incorporated herein in its entirety by reference.

REFERENCE SIGNS LIST

10 Socket
10A Socket
20 Inspection target object
22 Ball
30 Inspection board
32 Pad
100 Probe
100A Probe
100B Probe
110 First plunger
110A First plunger
110B First plunger
112A Extension portion
114A Tip end head
120 Second plunger
120A Second plunger
120B Second plunger
122A Base end portion
124A Hole
126A Locking portion
130 Tube
130B Tube
140 Spring
140A Spring
140B Spring
200 Insulation support body
902 Column portion
904 Contact portion

The invention claimed is:

1. A probe formed of an alloy, the alloy comprising:

greater than or equal to 15 mass % and less than or equal to 60 mass % of Pd;

greater than or equal to 3 mass % and less than or equal to 79.9 mass % of Cu; and greater than or equal to 0.1 mass % and less than or equal to 75 mass % of at least one of Ni and Pt, wherein when the alloy and a solder undergo heat treatment, the alloy has a solder resistance such that a diffusion layer in which both the solder and the Pd exist is less than or equal to 200 μm.

2. The probe according to claim 1, wherein the solder is a Sn—Bi based solder.

3. The probe according to claim 1, wherein the heat treatment is conducted at 250° C. for 1 hour.

4. The probe according to claim 1, wherein the alloy constitutes at least a tip end of the probe.

5. The probe according to claim 4, wherein the tip end of the probe includes a plurality of points around a central axis of the probe.

6. The probe according to claim 1, wherein the alloy comprises:

greater than or equal to 20 mass % and less than or equal to 48 mass % of Pd;

greater than or equal to 5 mass % and less than or equal to 74 mass % of Cu; and greater than or equal to 0.5 mass % and less than or equal to 70 mass % of at least one of Ni and Pt.

7. The probe according to claim 1, wherein the alloy does not contain Ag.

8. The probe according to claim 1, wherein the alloy does not contain In.

9. The probe according to claim 1, wherein the alloy does not contain Ag or In.

10. The probe according to claim 1, wherein the alloy contains both Ni and Pt.

11. The probe according to claim 1, wherein the probe includes a plunger having a tip end, and wherein the plunger is formed of the alloy.

12. The probe according to claim 11, wherein the tip end of the plunger includes a plurality of points.

13. The probe according to claim 1, wherein the probe is configured to electrically connect an inspection target object to an inspection board.

14. The probe according to claim 13, wherein the inspection target object includes the solder.

15. A socket for electrically connecting an inspection target object to an inspection board, the socket comprising the probe of claim 1.

\*    \*    \*    \*    \*